(12) United States Patent
Martin

(10) Patent No.: US 6,614,341 B2
(45) Date of Patent: *Sep. 2, 2003

(54) THICK FILM CIRCUIT WITH FUSE

(75) Inventor: Shaun G. Martin, Bedlington (GB)

(73) Assignee: International Resistive Company, Inc., Corpus Christi, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 62 days.

(21) Appl. No.: 09/768,097

(22) Filed: Jan. 22, 2001

(65) Prior Publication Data
US 2002/0097134 A1 Jul. 25, 2002

(30) Foreign Application Priority Data
Jan. 24, 2000 (GB) ............................................ 0001573

(51) Int. Cl.[7] .......................... H01H 85/08; H01H 85/20
(52) U.S. Cl. ...................... 337/297; 337/295; 337/160; 29/623; 361/104
(58) Field of Search ................................. 337/297, 159, 337/160, 295, 296, 290; 29/623; 361/104, 626

(56) References Cited

U.S. PATENT DOCUMENTS

| | | | |
|---|---|---|---|
| 3,585,556 A | * 6/1971 | Hingorany et al. | ......... 337/297 |
| 3,638,083 A | 1/1972 | Dornfeld | |
| 4,006,443 A | 2/1977 | Kouchich | |
| 4,394,639 A | * 7/1983 | McGalliard | ................. 337/292 |
| 4,494,104 A | 1/1985 | Holmes | |
| 4,533,896 A | 8/1985 | Belopolsky | |
| 4,635,023 A | * 1/1987 | Oh | ............................. 337/163 |
| 4,679,310 A | 7/1987 | Ramachandra | |
| 5,084,691 A | 1/1992 | Lester | |
| 5,097,247 A | * 3/1992 | Doerrwaechter | ............. 29/623 |
| 5,099,219 A | * 3/1992 | Roberts | ....................... 29/623 |
| 5,130,689 A | 7/1992 | Raykhtsaum | |
| 5,166,656 A | * 11/1992 | Badihi et al. | ................ 337/227 |
| 5,453,726 A | * 9/1995 | Montgomery | ................ 29/623 |
| 5,543,774 A | * 8/1996 | Lof | ............................... 29/623 |
| 5,923,239 A | * 7/1999 | Krueger et al. | ............. 337/152 |

FOREIGN PATENT DOCUMENTS

| | | | |
|---|---|---|---|
| AT | 383 697 B | 8/1987 | |
| DE | 1 490 781 | 7/1969 | |
| GB | 1114804 | * 5/1968 | .......... H01H/85/04 |
| GB | 2 089 148 A | 6/1982 | |
| WO | PCT US96 09147 | 12/1996 | |
| WO | PCT US98 25417 | 6/1999 | |

* cited by examiner

Primary Examiner—Anatoly Vortman
(74) Attorney, Agent, or Firm—G. Turner Moller

(57) ABSTRACT

A thick film circuit on an insulating substrate includes a thermal fuse. The circuit includes a conductive strip, which may be sufficiently resistive to comprise the resistor of an automotive fan motor controller, which is made of a material dissolved by a solder which melts at a predetermined temperature. When an abnormal event occurs which raises the temperature of the circuit, the solder melts and dissolves the underlying conductive strip. The solder and melted material of the strip then coalesce into one or more droplets thereby breaking the circuit.

19 Claims, 2 Drawing Sheets

Globule of solder and dissolved conductor (12)

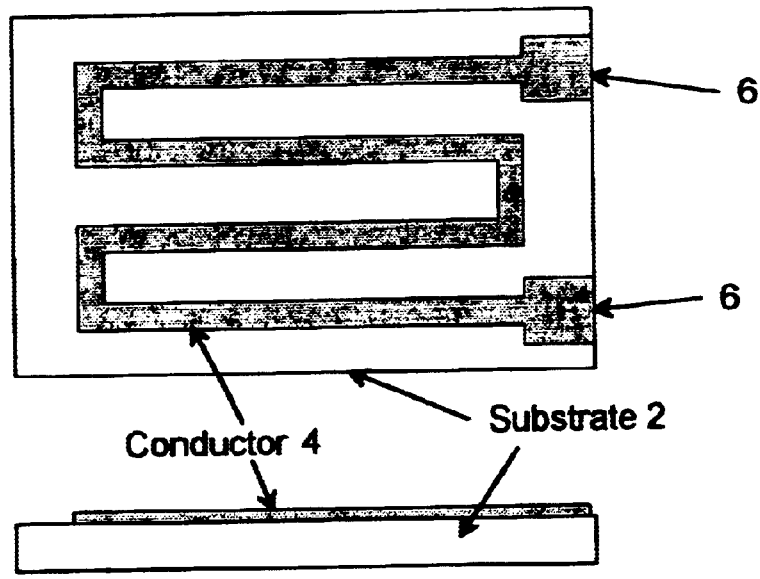
Fig. 1
Fig. 2
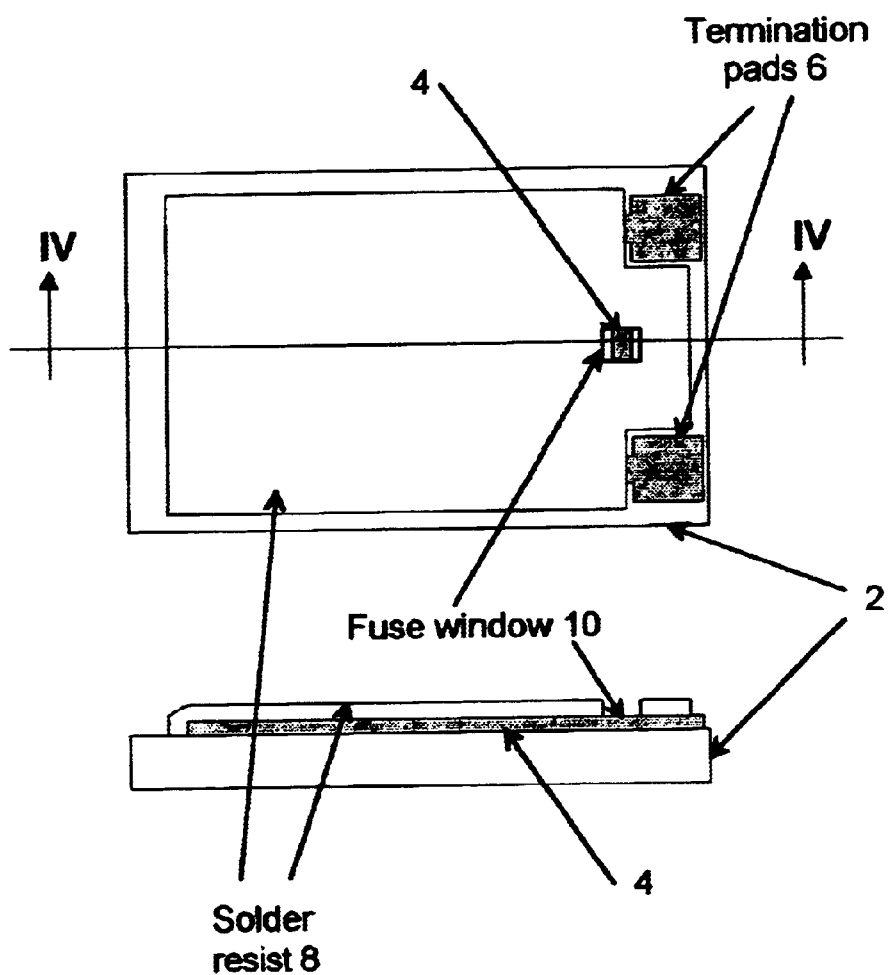
Fig. 3
Fig. 4

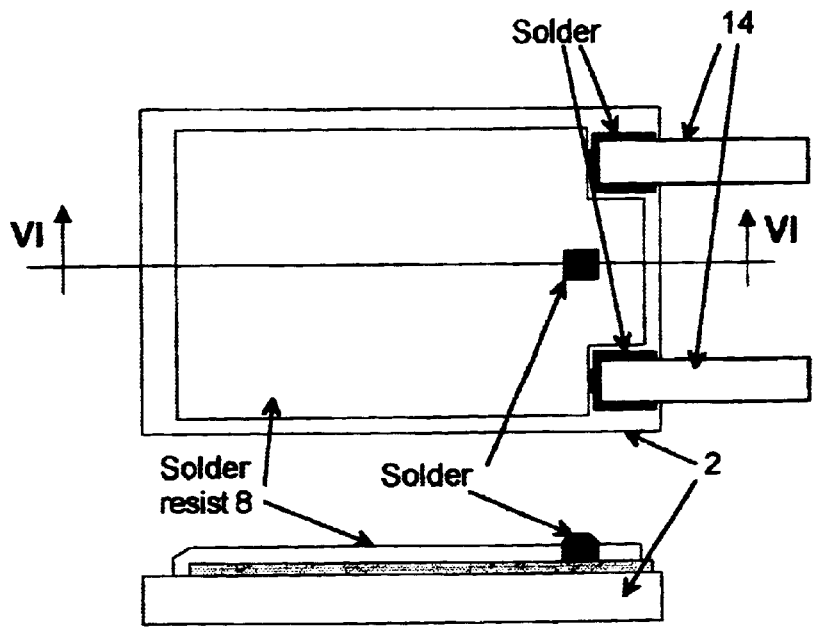
Fig. 5
Fig. 6
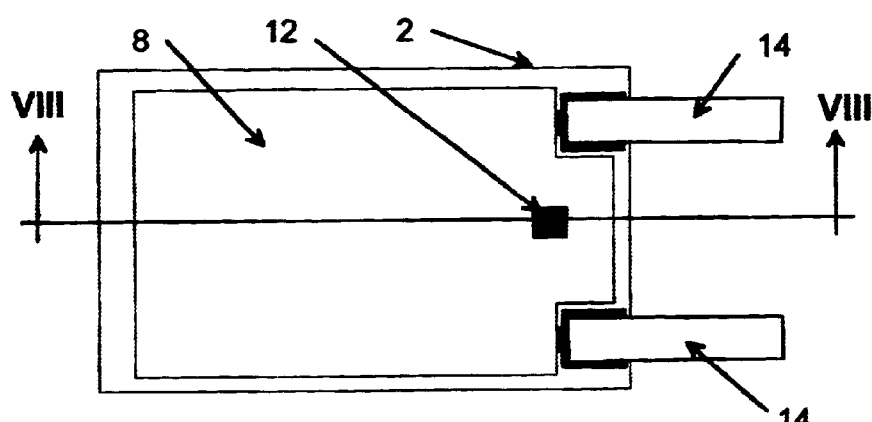
Fig. 7
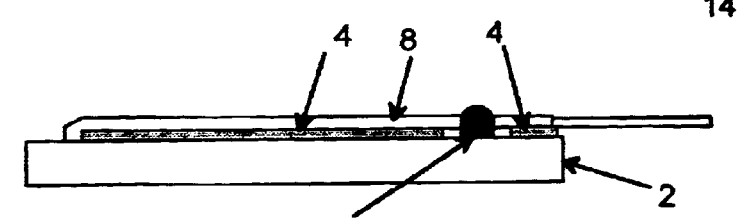
Fig. 8
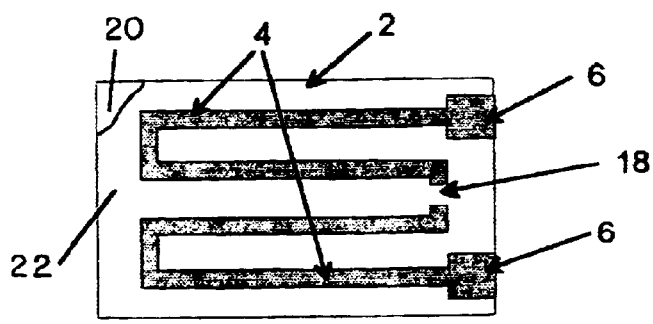
Fig. 9

THICK FILM CIRCUIT WITH FUSE

This invention relates to thick film circuits provided with fuses, and more particularly to such circuits provided with heat activated solder fuses for protecting the associated circuits.

BACKGROUND OF THE INVENTION

It is established practice to provide thick film circuits in which electrically conducting tracks disposed on the surface of an electrically insulating substrate incorporate a conductive link comprising or including solder which, when a fault condition arises, melts to cause the associated circuit to be broken.

In one such known arrangement, a spring fuse under compression is soldered between terminals ends of electrically conducting tracks whereby, on melting of the solder, the fuse springs apart and breaks the circuit.

Such fuses are relatively complex and expensive to manufacture, and can be difficult and time-consuming to install.

In another known arrangement, the fuse comprises solder bridging the terminals ends of the electrically conducting tracks. The solder may be in the form of a strip of material linking the ends of the two tracts such that, on overheating, the solder melts, withdraws onto the terminal ends of the tracks, and breaks the circuit.

Again, installation of such links can be awkward while the nature of the link can be such as to impose a degree of unreliability on the precise temperature at which the circuit is broken—under certain circumstances during the fusing process such links have been known to drop off the associated substrate.

Alternatively, the solder may comprise a first solder material deposited on the terminal ends of the two tracks, and a second solder material deposited on the first solder material and filling the gap between the track ends. The two solder materials melt at different temperatures, and are chosen dependent on circumstances. In practice, the second solder material melts at the desired actuation temperature of the fuse, and, on melting flows onto the first solder material on the terminal ends to create a gap and break the circuit.

The manufacture of such a fuse is clearly a relatively complex procedure, while the cost is significant in view of the two separate solder materials used.

In all the above-mentioned solder fuses, breaking the circuit is dependent upon on melting of the solder and subsequent separation of the melted solder by flowing onto the spaced-apart conductive terminal ends of the tracks, thereby to create a gap between the terminal ends.

SUMMARY OF THE INVENTION

It would be desirable to be able to provide a heat actuated solder fuse for thick film circuits that is more easily and more cheaply produced than heretofore, and which is less reliant upon molten flow than current arrangements.

According to one aspect of the present invention there is provided a thick or thin film circuit comprising an electrically insulating substrate having deposited thereon an electrically conductive track the material of which is capable of being leached by molten solder, and, deposited on said track, a volume of solder having a predetermined melting temperature, the arrangement being such that, on melting of the solder at said predetermined temperature, the molten solder leaches the material of the track, creates a gap therein, and thereby breaks an electrical circuit through said track.

It will be appreciated that such a fuse is readily manufactured, it merely being necessary to deposit the solder in the required position on the substrate, which deposition step can be integrated into the screen printing process associated with formation of the thick film circuit itself.

In a preferred embodiment of the invention, the material of the electrically conductive track is silver or a silver-based alloy, while the solder contains tin.

In a preferred embodiment of the invention, the conductive track provides a resistor of a fan motor controller so the fuse is incorporated into the resistor with a minimum of operations.

The electrically conductive track may be continuous with the volume of solder deposited on, to cover a length of, the continuous track.

Alternatively the track may comprise a pair of spaced-apart terminals with the volume of solder deposited on said terminals and extending across the gap between the terminals.

According to a second aspect of the invention, there is provided a method of manufacturing a thick film circuit as defined above, the method comprising the steps of providing an electrically insulating substrate;

depositing on said substrate an electrically conductive track the material of which is capable of being leached by molten solder;

depositing onto the substrate and onto all of the electrically conductive track except that part thereof to be covered by the solder a solder resist, and depositing on said part of the electrically conductive track a volume of solder having a predetermined melting temperature whereby, on melting of the solder at said predetermined temperature, the molten solder leaches the material of the electrically conductive track to create a gap therein thereby to break an electrical circuit through the track.

It is an object of this invention to provide an electrical component having an improved thermal fuse.

A further object of this invention is to provide a method of manufacturing an improved thermal fuse on an insulating substrate.

These and other objects and advantages of this invention will become more apparent as this description proceeds, reference being made to the accompanying drawings and appended claims.

BRIEF DESCRIPTION OF THE DRAWINGS

FIG. 1 is a plan view from above of a screen printed and fired substrate of a thick film circuit according to the invention;

FIG. 2 is a side view of the substrate of FIG. 1;

FIG. 3 is a plan view from above of the substrate of FIG. 1 with solder resist applied;

FIG. 4 is a section on the line IV—IV of FIG. 3;

FIG. 5 is a plan view from above of the substrate of FIG. 3 after reflow soldering;

FIG. 6 is a section on the line VI—VI of FIG. 5;

FIG. 7 is a plan view of part of the substrate of FIG. 5 after operation of the fuse;

FIG. 8 is a section on the line VIII—VIII of FIG. 7; and

FIG. 9 is a plane view from above of an alternative screen printed and fired substrate of a thick film circuit according to the invention.

DETAILED DESCRIPTION

Referring to FIGS. 1 and 2 if the drawings, there is shown a ceramic substrate 2, a silver-based conductor track 4 and termination pads 6. As used herein, the track 4 is referred to as a conductive or conductor track even through it may have quite high resistance and provide a resistor for use in an end product such as a resistive fan motor controller for an automotive heating and/or air conditioning system. The track 4 and pads 6 are formed by thick-film processing methods, i.e. screen printing and firing at elevated temperatures. In the event the track 4 is to be a resistor, a suitable composition for use on an alumina substrate is Silver Conductor Composition 3524, available from Metech, Inc., Ontario, Calif. This material has a resistance of 1.5 milliohms/square/mil. It will be seen that the material of the track 4 is essentially the same from one end of the track to the other, i.e. the material of the track 4 is generally homogenous which means it can be laid down in one pass rather than in multiple passes.

The area of the substrate 2 and track 4 that are not to be soldered are coated with a solder resist material 8 as shown in FIGS. 3 and 4 which is cured using ultra violet light. The solder resist 8 protects the track 4 from the effects of corrosion and mechanical damage and exposes the termination pads 6 and a fuse window 10 intermediate the length of the track 4 between the termination pads 6.

Solder is then screen printed onto the termination pads 6 and onto the extent of the track 4 exposed through the window 10, this fuse solder at the window 10 being referenced 12, terminals 14 are fitted to the termination pads 6, and the complete assembly is reflow soldered as shown in FIGS. 5 and 6. The composition of the solder is 96.5 tin:3.5 silver, by weight, which has a melting temperature of 221° C. An important feature of this invention is the solder 12 may be reflowed, by a judicious selection of the temperature of and the duration of the elevated temperature, during reflow soldering without completely dissolving the track 4 and thereby prematurely causing the solder 12 to coalesce and prematurely open the circuit. For this reason, this invention is particularly suited to thick film devices where the underlying track 4 is much less susceptible to leaching and premature opening of the circuit for the simple reason that the track 4 is thicker. As used herein, thick film devices normally incorporate films of at least one half mil thick and typically less than two mils thick.

The described thick film circuit is designed to operate at temperatures of significantly less than 221° C., typically at a maximum of 150° C., under normal working conditions. Under normal working conditions where the track 4 is a resistor, the bulk of current flow in the region of the solder 12 is through the solder, which is much more conductive than the track 4.

When a fault occurs in the circuit, for example an overcurrent, the track 4 and substrate 2 heat up beyond 150° C. and, at 221° C., the solder 12 comprising the fuse in the window 10 melts—the circuit design is such that the temperature of the solder in the area of the termination pads 6 is lower than that at the window 10 under fault conditions.

The molten fuse solder 12 begins to dissolve the metal of the conductor track 4 beneath it in a process known as leaching. The high tin content (96.5%) of the solder 12 beings to dissolve the silver within the track 4 whereby, after a predetermined period of time, the silver of the track 4 beneath the solder 12 will have been dissolved to such an extent at so cause the circuit to be broken.

More particularly, and referring to FIGS. 7 and 8, the molten solder 12 melts and forms a globule as shown in FIG. 8 with the solder resist 8 serving to locate the globule. The solder 12 has a natural tendency to dissolve the metal of the track 4 and to disengage itself from the dielectric substrate 2, which further encourages the creation of the globule. The leaching continues until the circuit is broken.

FIG. 1 shows a continuous conductive track 4 between the termination pads 6. Alternatively, the track 4 could be printed as a discontinuous length as shown in FIG. 9 which a gap 18 therein, the solder 12 of the fuse being deposited over the gap 18 and over the adjacent ends of the discontinuous track 4.

The continuous tract 4 of FIGS. 1 to 8 has the advantage that the resistance thereof can be measured at the preproduction stage, and any faulty units can be discarded before reflow soldering and fitting of the terminals 14.

The invention is applicable to thick film conductive materials providing they are capable of being leached by solder, which solder may itself be alloyed with small quantities of, for example, palladium or platinum to prevent leaching. However, other conductive metals, for example palladium, copper and in particular gold, may be used for the track 4. Gold and silver are preferred because they will leach appreciably at temperatures of around 220° C.

The preferred solder is an alloy comprising 96.5% tin and 3.5% silver which has a melting point of 221° C., although other solder alloys, in particular alloys of tin, lead and/or silver, can be used depending upon the melting point and silver dissolution rate required.

The substrate 2 may be of any suitable material, for example a metal 20 such as aluminum with a dielectric skin 22 as shown in FIG. 9, a ceramic or an organic board, while the electrical component may include further layers over the solder resist material 8, for example one or more dielectric/insulating over-layers.

The described fuse has a variety of applications where undesirable increases in temperature or current are to be avoided, for example in the control of automobile heaters—in the event hat there is a lack of cooling air and/or an increase in current beyond an acceptable level, the solder 12 of the fuse melts and deactivates the heater. Other applications will be apparent to those skilled in the art.

Thus there is provided a thick film circuit provided with a solder fuse which relies upon the heretofore undesirable feature of leaching to effect operation. While operating normally, the solder 12 remains solid. Under fault conditions, the solder melts, leaches the conductive track and breaks the circuit.

Such a fuse is easily integrated into the screen printing process used to form the other components parts of the circuit, the fabrication of the fuse is inexpensive compared with other fuses.

Although this invention has been disclosed and described in its preferred forms with a certain degree of particularity, it is understood that the present disclosure of the preferred forms is only by way of example and that numerous changes in the details of operation and in the combination and arrangement of parts may be resorted to without departing from the spirit and scope of the invention as hereinafter claimed.

I claim:

1. An electrical component comprising
an insulating substrate having terminals and an electrically conductive track, between the terminals, of a generally homogenous material which is capable of being leached by molten solder, the electrically conductive tract has a length much greater than its width and the solder covers only a minor portion of the length of the conductive track; and a thermally responsive fuse comprising solder on at least a portion of the electrically conductive track, the solder having a predetermined melting temperature whereby, on melting of the solder at the predetermined temperature, the molten solder leaches the material of the electrically conductive track to create a gap therein thereby to break an electrical circuit through the track.

2. The electrical component of claim 1 wherein the electrically conductive track is continuous.

3. The electrical component of claim 1 wherein the electrically conductive track is a thick film layer at least one half mil thick.

4. The electrical component of claim 3 wherein the electrically conductive track is a resistor.

5. The electrical component of claim 4 wherein the electrical component is a fan motor controller.

6. The electrical component of claim 5 wherein the substrate is a metal having a dielectric skin.

7. The electrical component of claim 6 wherein the metal is aluminum.

8. The electrical component of claim 1 wherein the electrically conductive track is a silver alloy having a resistance of about 1.5 milliohms/square/mil.

9. The electrical component of claim 8 wherein the solder is 96.5 tin:3.5 silver, by weight, having a melting temperature of 221° C.

10. The electrical component of clam 1 wherein the conductive track provides ends having a gap therebetween and the solder spans the gap, overlying the ends of the conductive track.

11. An electrical component comprising an insulating substrate having terminals and an electrically conductive track, between the terminals, of a generally homogenous material which is capable of being leached by molten solder, the electrically conductive tract provides ends having a first gap therebetween; and a thermally responsive fuse comprising solder, spanning the first gap, overlying the ends of the conductive track, the solder having a predetermined melting temperature whereby, on melting of the solder at the predetermined temperature, the molten solder leaches the material of the electrically conductive track to create a second gap therein thereby to break an electrical circuit through the track.

12. The method of making an electrical component, comprising providing an electrically insulating substrate;

depositing on the substrate a homogenous electrically conductive track of a length much greater than its width, the material of which is capable of being leached by molten solder;

depositing, onto the substrate and onto all of the electrically conductive track except a portion to be covered by the solder, a solder resist; and depositing on said part of the electrically conductive track a volume of solder, over only a minor portion of the length of the track, having a predetermined melting temperature whereby, on melting of the solder at said predetermined temperature, the molten solder leaches the material of the electrically conductive track to create a gap therein thereby to break an electrical circuit through the track.

13. The method of claim 12 wherein the conductive track provides terminals adjacent edges of the substrate and the conductive track is continuous between the terminals.

14. The method of claim 12 wherein the conductive track provides terminals adjacent edges of the substrate and the conductive track provides ends having a gap therebetween, the solder spanning the gap and overlying the track ends.

15. The method of claim 12 wherein the conductive track is of a silver alloy having a resistivity of about 1.5 milliohms/square/-mil.

16. The method of claim 15 wherein the conductive track comprises a resistor.

17. The method of claim 16 wherein the resistor is part of a fan motor controller.

18. An electrical component comprising an insulating substrate having terminals and an electrically conductive track, between the terminals, of a generally homogenous material which is capable of being leached by molten solder; and a thermally responsive fuse comprising solder covering only a minor portion of the electrically conductive track, the solder having a predetermined melting temperature whereby, on melting of the solder at the predetermined temperature, the molten solder leaches the material of the electrically conductive track to create a gap therein thereby to break an electrical circuit through the track.

19. The method of making an electrical component, comprising providing an electrically insulating substrate;

depositing on the substrate a homogenous electrically conductive track the material of which is capable of being leached by molten solder;

depositing, onto the substrate and onto all of the electrically conductive track except a portion to be covered by the solder, a solder resist; and depositing on said part of the electrically conductive track a volume of solder over only a minor portion of the conductive track, having a predetermined melting temperature whereby, on melting of the solder at said predetermined temperature, the molten solder leaches the material of the electrically conductive track to create a gap therein thereby to break an electrical circuit through the track.

* * * * *